United States Patent
Bonetti

(10) Patent No.: US 11,029,360 B2
(45) Date of Patent: Jun. 8, 2021

(54) ELECTRIC CURRENT PROTECTION CIRCUIT AND METHOD OF USING SAME

(71) Applicant: Vitesco Technologies USA, LLC, Auburn Hills, MI (US)

(72) Inventor: Robert Arthur Bonetti, Leonard, MI (US)

(73) Assignee: Vitesco Technologies USA, LLC, Auburn Hills, MI (US)

( * ) Notice: Subject to any disclaimer, the term of this patent is extended or adjusted under 35 U.S.C. 154(b) by 0 days.

(21) Appl. No.: 16/718,965

(22) Filed: Dec. 18, 2019

(65) Prior Publication Data

US 2020/0209314 A1 Jul. 2, 2020

Related U.S. Application Data

(60) Provisional application No. 62/786,520, filed on Dec. 30, 2018.

(51) Int. Cl.
*G01R 31/364* (2019.01)
*B60L 3/12* (2006.01)
(Continued)

(52) U.S. Cl.
CPC .............. *G01R 31/364* (2019.01); *B60L 3/12* (2013.01); *B60L 58/12* (2019.02); *G01R 31/2863* (2013.01); *G01R 31/3278* (2013.01)

(58) Field of Classification Search
CPC .. B60L 58/12; G01R 31/3278; G01R 31/2863
See application file for complete search history.

(56) References Cited

U.S. PATENT DOCUMENTS

| 2013/0009464 A1* | 1/2013 | Firehammer | H01M 10/48 |
| | | | 307/9.1 |
| 2014/0009162 A1 | 1/2014 | Barrenscheen et al. | |

(Continued)

FOREIGN PATENT DOCUMENTS

| DE | 4427084 A1 | 2/1996 |
| DE | 102012008601 A1 | 10/2013 |

(Continued)

OTHER PUBLICATIONS

International Search Report and the Written Opinion of the International Searching Authority dated May 6, 2020 for the counterpart PCT Application No. PCT/2019/068290.

*Primary Examiner* — Alvaro E Fortich

(57) ABSTRACT

A protection device for a vehicle electrical system, including a battery pack having at least one contactor. A microcontroller generates a test pulse at a pulse output thereof and a sense input terminal. The microcontroller has at least one output coupled to the control terminal of the at least one contactor. A first capacitor has a terminal coupled to a first terminal of the at least one contactor; a second capacitor having a terminal coupled to a second terminal of the at least one contactor; and circuitry coupled between the microcontroller and the first and second capacitors. The circuitry reflects the test pulse to the sense input terminal if each contactor is open when the microcontroller applies a contactor opening voltage to the contactor control terminal, and presents a signal different from the reflected test pulse to the sense input terminal of the microcontroller if any contactor is welded shut.

18 Claims, 4 Drawing Sheets

(51) Int. Cl.
  *B60L 58/12*    (2019.01)
  *G01R 31/327*   (2006.01)
  *G01R 31/28*    (2006.01)

(56) References Cited

U.S. PATENT DOCUMENTS

2017/0205455 A1* 7/2017 Weicker .............. G01R 31/382
2018/0024196 A1* 1/2018 Imura ................ G01R 31/3277
                                              324/762.01

FOREIGN PATENT DOCUMENTS

DE      102014111335 B3   11/2015
JP          2013068479 A    4/2013

* cited by examiner

ELECTRIC CURRENT PROTECTION CIRCUIT AND METHOD OF USING SAME

CROSS REFERENCE TO RELATED APPLICATION

The present application claims the benefit from U.S. provisional application No. 62/786,520, filed Dec. 30, 2018, and titled "Electric Current Protection Circuit and Method of Using Same," the content of which is incorporated by reference herein in its entirety.

FIELD OF THE INVENTION

The present invention relates generally to detection circuitry for detecting welded-closed contactors in a high voltage battery pack of a vehicle electrical system.

BACKGROUND

High voltage battery packs used in some vehicles, including but not limited to electric vehicles, use two to three sets of contactors to provide safety and protection from potentially harmful electrical currents. High voltage battery packs are electrically isolated from chassis ground and the 12 volt electrical system of the vehicle. Unfortunately, contactors have the potential to weld shut caused by arcing across the contacts.

SUMMARY

Example embodiments are generally directed to detection circuitry for detecting welded-closed contactors in a high voltage battery pack of a vehicle electrical system, and alerting the vehicle diagnostic system without violating isolation between the high voltage system and the low voltage system.

An example embodiment is disclosed for a protection device for protecting an electrical system in a vehicle. The electrical system includes a battery pack having at least one contactor, and a high voltage bus connected to the battery pack. The protection device includes a microcontroller which generates test pulses at a pulse output terminal thereof and includes a sense input terminal. The microcontroller has additional output terminals coupled to a control terminal of the at least one contactor. A first capacitor has a first terminal coupled to a first terminal of the at least one contactor. A second capacitor has a first terminal coupled to a second terminal of the at least one contactor. Circuitry is coupled between the microcontroller and the first and second capacitors, the circuitry having an input terminal connected to the pulse output terminal of the microcontroller and an output terminal connected to the sense input terminal of the microcontroller. The circuitry reflects the test pulses to the sense input terminal of the microcontroller if each contactor is open when the microcontroller applies a contactor opening voltage to the control terminal of the at least one contactor to open same, and presents a signal different from the reflected test pulses to the sense input terminal of the microcontroller if any contactor is welded shut when the microcontroller applies the contactor opening voltage to the control terminal of the at least one contactor.

In the example embodiment, the circuitry is powered by a voltage supply. The circuitry charges the first and second capacitors when any contactor is closed and does not charge the first and second capacitors when each contactor is open. The first and second capacitors are coupled to the sense input terminal of the microcontroller such that a voltage at the sense input terminal of the microcontroller corresponds to a voltage across one or more of the first capacitor and the second capacitor.

In an implementation, the circuitry includes a first transistor having a first conduction terminal coupled to the voltage supply, a second conduction terminal coupled to a second terminal of the first capacitor, and a control terminal. A second transistor has a first conduction terminal coupled to the control terminal of the first transistor, a second conduction terminal coupled to a second terminal of the second capacitor, and a control terminal coupled to the pulse output terminal of the microcontroller. A resistor is coupled between the second terminal of the first capacitor and a reference voltage. A voltage appearing at the second terminal of the first capacitor is coupled to the sense input terminal of the microcontroller.

In this implementation, when each contactor is open, the first capacitor and the second capacitor are disconnected from each other and creates an open circuit along an electrical path defined along the second conduction terminal of the first transistor, the first capacitor, the second capacitor and the reference voltage. When any contactor is closed, the electrical path is closed.

The microcontroller is configured such that, based upon the voltage at the sense input terminal of the microcontroller, the microcontroller determines whether any contactor is welded closed and whether each contactor is open. Based upon the voltage at the sense input terminal of the microcontroller, the microcontroller is further configured to determine whether any current leakage exists across the at least one contactor. Based upon the voltage at the sense input terminal of the microcontroller, the microcontroller is further configured to determine an amount of current leakage across at least one contactor.

The at least one contactor of the battery pack includes a plurality of contactors, each contactor having a first terminal coupled to the first terminal of the first capacitor and a second terminal coupled to the first terminal of the second capacitor.

When each contactor is open, the first capacitor and the second capacitor are disconnected from each other and creates an open circuit along an electrical path defined along a power supply which powers the circuitry, the first capacitor, the second capacitor and a ground reference. When any contactor is closed, the electrical path is closed.

BRIEF DESCRIPTION OF THE DRAWINGS

The present invention will become more fully understood from the detailed description and the accompanying drawings, wherein.

DETAILED DESCRIPTION

The following description of the example embodiment(s) is merely exemplary in nature and is in no way intended to limit the invention, its application, or uses.

Figure 1:
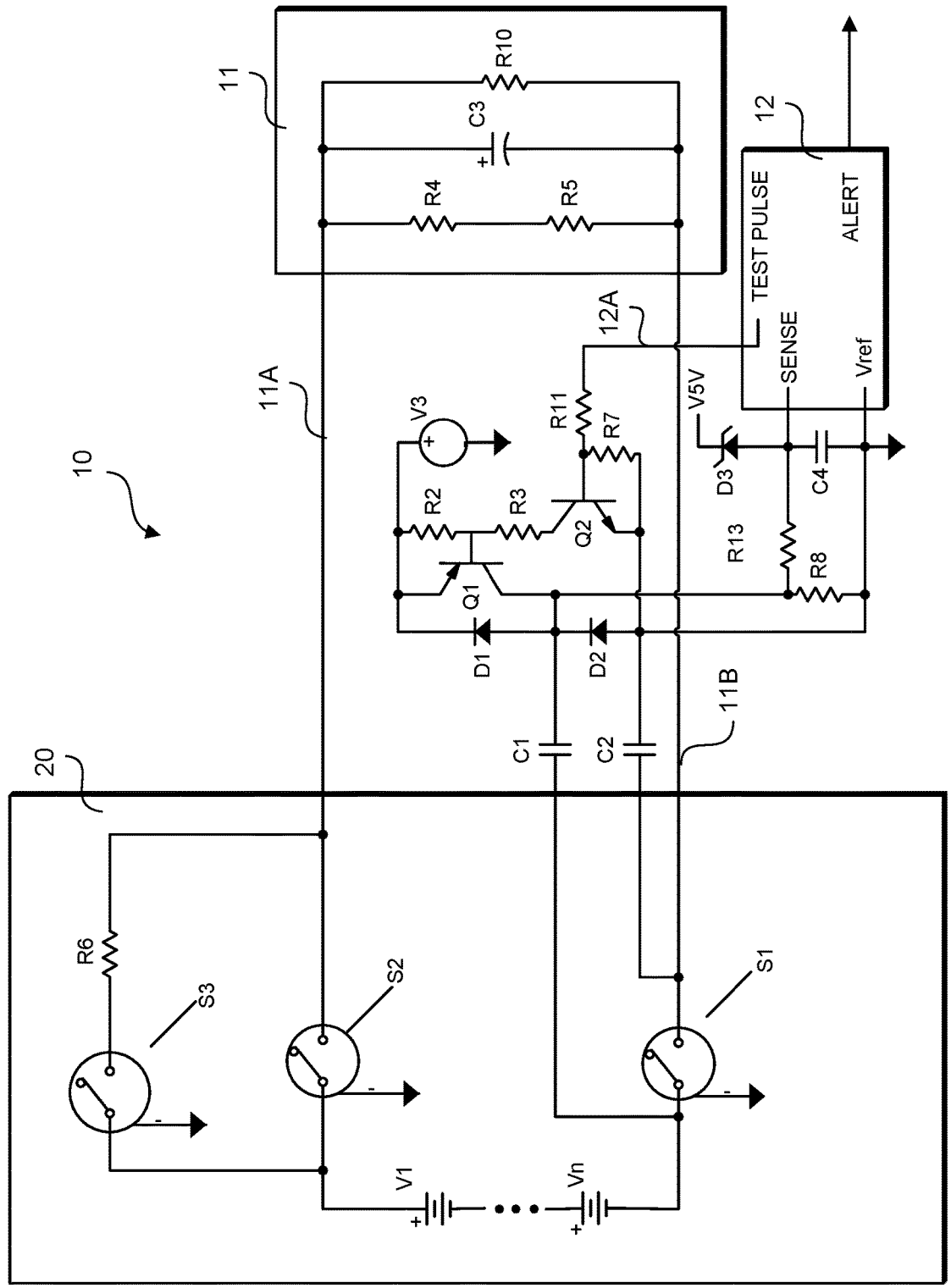
FIG. 1 is a schematic diagram of a protection circuit for a vehicle electrical system according to an example embodiment.

Referring to FIG. 1, there is shown a protection circuit 10 for an electrical system of a vehicle. The electrical system includes a high voltage battery pack 20. Protection circuit 10 is powered by a battery V3, which may be a 12V battery, and presents a pulsed signal, through two capacitors C1 and C2, and across any contactor S1, S2, S3 of the high voltage battery pack 20. This protection circuit 10 maintains galvanic isolation from the high voltage system through the capacitors C1 and C2. The capacitors C1, C2 are rated for the full voltage of the battery pack 20. A high-voltage bus 11 of the electrical system is depicted in FIG. 1 and is connected to battery pack 20. The depicted components of high-voltage bus 11 represent various loads and capacitances of components on the high voltage bus which may include: a motor inverter, a battery charger, a DC-DC converter (providing a high voltage to 12V) and any other electrical load. Capacitor C3 and resistor R10 are parasitic bus loads and do not represent a particular component on the high voltage bus 11. Resistors R4 and R5 represent a voltage divider used to measure the voltage on the high voltage bus 11.

Protection circuit 10 includes a microcontroller 12 having signal generating circuitry which generates an output signal 12A which provides a pulsed voltage, serving as test pulses, to capacitor C1. Microcontroller 12 generates the test pulses of a predetermined voltage and duration which may be the voltage across battery V3 or a lesser voltage. Microcontroller 12 may be a microcontroller of the vehicle, such as the vehicle's electrical (or engine) control unit (ECU). The signal generating circuitry of microcontroller 12 may include or perform as a monostable multivibrator circuit that receives a control pulse or signal generated within the microcontroller. The microcontroller 12 may enable or activate the signal generating circuitry at predetermined times during vehicle operation. Monostable multivibrators are notoriously well known such that a detailed description of signal generating circuit 12 will not be provided for reasons of expediency.

Protection circuit 10 further includes npn bipolar transistor Q2 having a control or base terminal coupled to output 12A of signal generating circuit 12 via resistor R11. A pnp bipolar transistor Q1 is connected between battery V3 and transistor Q2. A resistor R2 is connected between the emitter and base terminals of transistor Q1, and resistor R3 which is connected between the base terminal of transistor Q1 and the collector terminal of transistor Q2. The collector terminal of transistor Q1 is connected to capacitor C1, and the emitter terminal of transistor Q2 is connected to capacitor C2. A diode D1 is disposed between the emitter and collector terminals of transistor Q1, with the diode's anode connected to the emitter of transistor Q1 and the diode's cathode connected to the collector of transistor Q1. A diode D2 is connected between the collector of transistor Q1 and the emitter of transistor Q2, with the diode's anode connected to the emitter of transistor Q2 and the diode's collector connected to the collector of transistor Q1. A resistor R8 is coupled between the collector terminal of transistor Q1 and ground, and a resistor R13 is connected between resistor R8 and a sense input to microcontroller 12.

It is understood that the particular implementation of the protection circuit 10 may utilize other types of transistors than the pnp transistor Q1 and the npn transistor Q2.

Battery pack 12 includes a stack of cells V1-Vn which combined form a battery. It is understood that there may be any number of cells which make up the battery. Contactor S3 is connected between one terminal 11A of high-voltage bus 11 (via series resistor R6) and the high-side (positive) terminal of the battery stack. Contactor S3 and resistor R6 represent a pre-charge contactor used to charge up the high voltage bus to prevent arcing when contactor S2 closes. Not all battery systems use a pre-charge contactor S3 but may employ a separate circuit to build up the bus voltage prior to contactor S2 closing. Contactor S2 is connected between the terminal 11A of high-voltage bus 11 and the high-side terminal of the battery stack. Contactor S1 is connected between the low-side (negative) terminal of the battery stack and the second terminal 11B of high-voltage bus 11. A second terminal of capacitor C1 is connected to the low-side terminal of the battery stack, and the second terminal of capacitor C2 is connected to the second terminal 11B of high-voltage bus 11.

During operation, if all of the contactors S1-S3 of the battery pack 20 are open, there is an open circuit between C1 and C2 and no current flows through the capacitors. This thus appears as a high impedance to transistor Q1. With contactors S1-S3 open, the voltage pulses of output signal 12A of microcontroller 12 are reflected as voltage pulses at the SENSE input of microcontroller 12. However, if any contactor S1-S3 is closed, such closure closes the circuit between capacitors C1 and C2 and provides an electrical path from the collector terminal of transistor Q1, through series-connected capacitors C1 and C2, to ground. When the voltage pulses of output signal 12A are applied, current flows through C1 and C2. Since transistor Q1 is only a current sourcing path, capacitors C1 and C2 retain their charge, and the voltage at the SENSE input of microcontroller 12 increases, in this case to a voltage greater than zero volts and less than the voltage at the supply voltage of battery V3. Microcontroller 12 detects the voltage signal at its SENSE input at predetermined times and determines whether there is an open contactor condition (in this case an undesirable closed contactor condition if the voltage applied to the control terminals of contactors S1-S3 is a contactor-opening voltage), a current leakage condition across a contactor or a loss of isolation of a contactor. Depending upon the condition determined, microcontroller 12 sends an alert to the vehicle diagnostic system (not shown) which may then indicate to a vehicle service provider of the need to replace a contactor S1-S3.

Protection circuit 10 allows for testing of any of contactors S1-S3 in electrical system while operating from an isolated voltage supply. Protection circuit 10 maintains galvanic isolation at all times, detects leakage across contactors and detects a change in external load capacitance.

Figure 3:
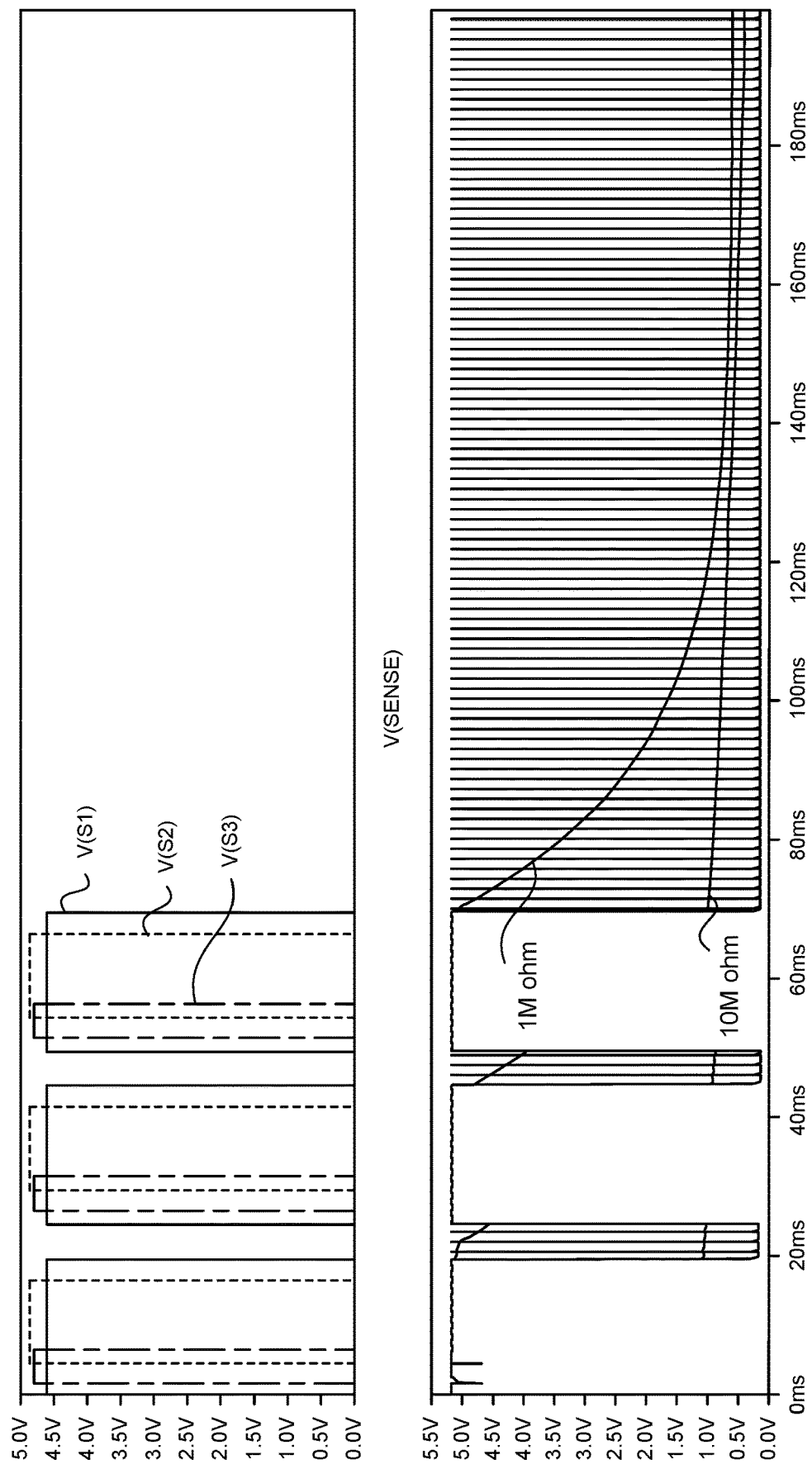
FIG. 3 illustrates voltage waveforms of the protection circuit of FIG. 1 when experiencing contactor current leakage.
Figure 4:
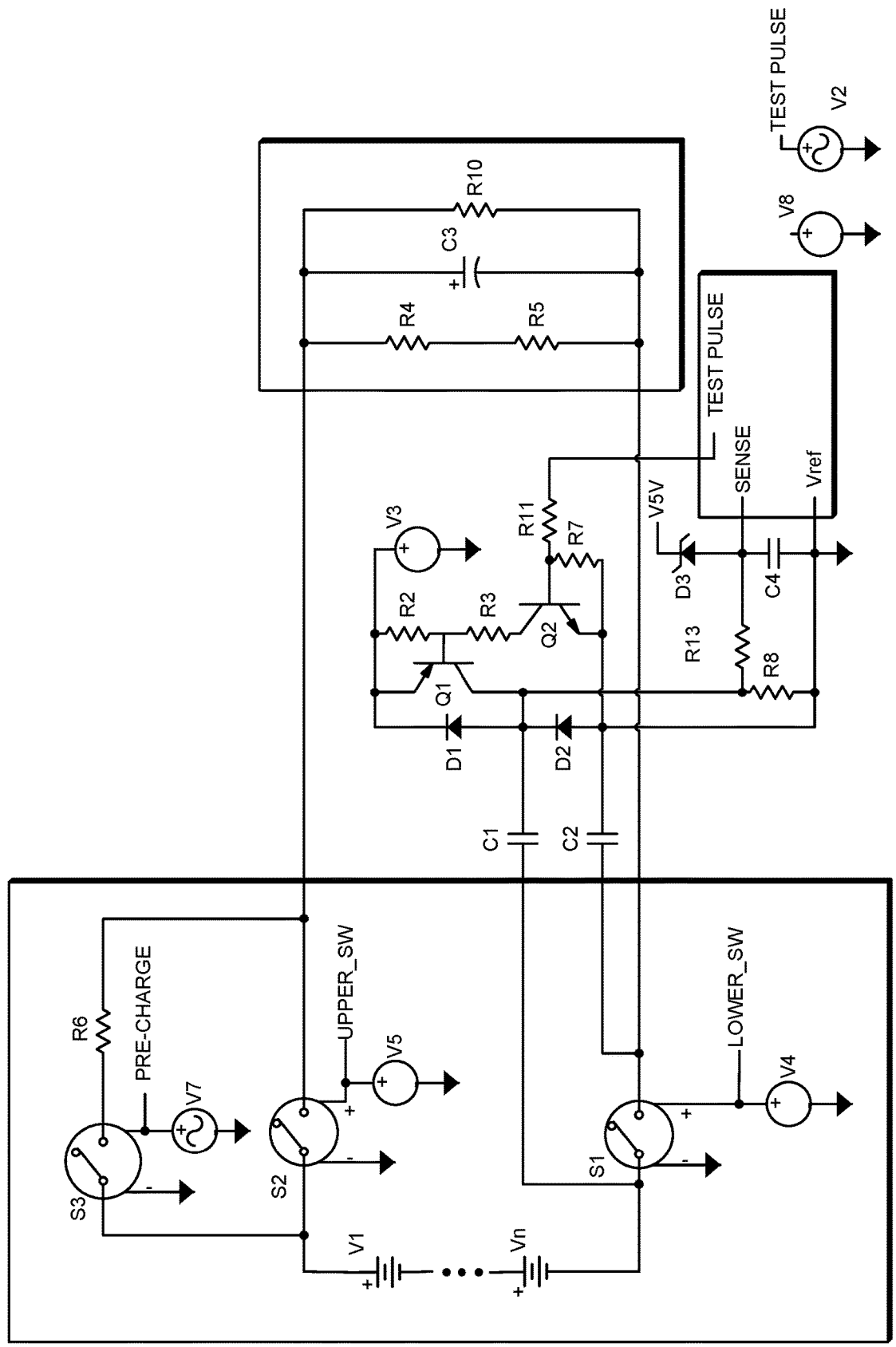
FIG. 4 illustrates a SPICE circuit depiction corresponding to the protection circuit of FIG. 1.

FIG. 4 is a PSpice interpretation of protection circuit 10 of FIG. 1. The waveforms of FIGS. 2-3 show the output voltage which is sensed by microcontroller 12.

Figure 2:
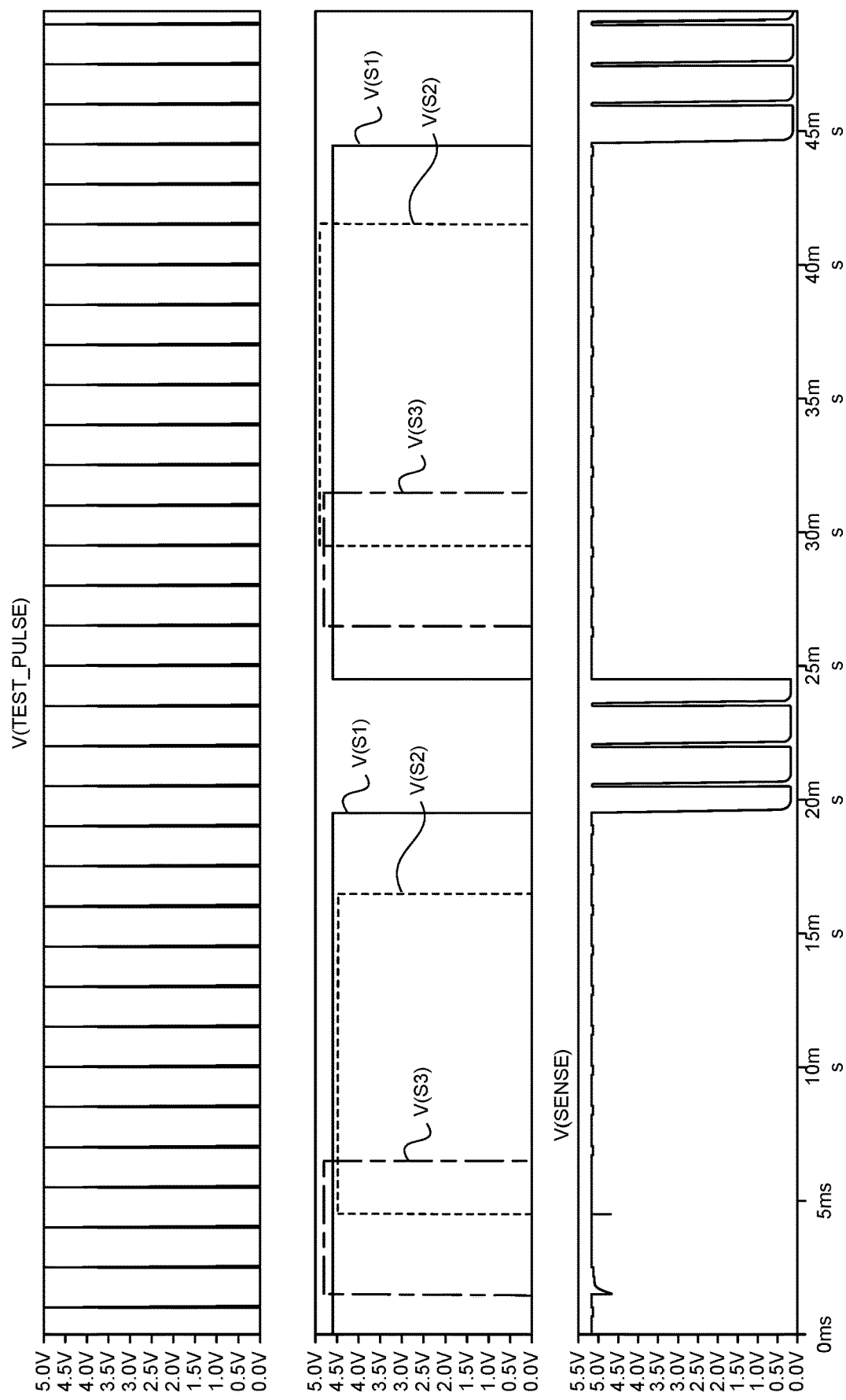
FIG. 2 illustrates voltage waveforms of the protection circuit of FIG. 1.

The top plot of FIG. 2 shows test pulses generated by the microcontroller 12. The middle plot of FIG. 2 shows the control voltages for opening and closing the contactors S1-S, which may also be generated by microcontroller 12. The bottom plot of FIG. 2 illustrates the voltage appearing at the SENSE input terminal of microcontroller 12. A high voltage in the middle plot indicates a contactor-closing voltage and that the corresponding contactor S1-S3 is closed, and zero volts indicates a contactor-opening voltage and the corresponding contactor is open. When all contactors S1-S3 are open, voltage pulses occur at the SENSE input of microcontroller 12 (as can be seen between 20 ms and 25 ms and between 45 ms and 50 ms in the lower plot of FIG. 2). When any contactor S1-S3 is closed (seen between 0 ms and 20 ms, and between 25 ms and 45 ms), the voltage at the SENSE input is about 5 volts.

FIG. 3 illustrates an operation of protection circuit 10 in which current leakage occurs in or through one or more of contactors S1-S3. Output signal 12A of microcontroller 12 is depicted as voltage spikes occurring every 1.25 ms. Contactors S1-S3 are controlled to be closed between 0-20 ms, 25-45 ms and 50-70 ms. During these times, the voltage at the SENSE input of microcontroller 12 is at the voltage of battery V3. As shown in the times between 20-25 ms and between 45-50 ms, when contactors S1-S3 are controlled to be opened, the voltage appearing at the SENSE input of microcontroller 12 corresponds to the voltage spikes at the output signal 12A. Thus, if one or more of contactors S1-S3 is closed due to being undesirably welded shut, the voltage appearing at the SENSE input of microcontroller 12 is at a voltage between ground and the voltage of battery V3; and if contactors S1-S3 are not welded shut, the voltage at the SENSE input of microcontroller 12 follows the voltage pulses at output signal 12A of the microcontroller when the contactors are controlled to be open.

FIG. 3 shows the effect of current leakage across a contactor S1-S3. The voltage indicated as "1M ohm" appearing at the SENSE input terminal shows a leakage of 1 Meg Ohm leakage across a contactor S1-S3. The line indicated as "10M ohm" corresponds to the effect of a 10 Meg Ohm leakage across the a contactor. As can be seen in FIG. 3, as leakage increases the voltage at the SENSE input terminal gradually creeps up to the voltage corresponding to a closed contactor S1-S3. By observing the voltage levels during each test pulse applied to protection circuit 10, microcontroller 12 is able to determine the amount of leakage through the leaking contactor S1-S3.

In another embodiment, protection circuit 10 is provided within battery pack 20 and powered by the high voltage battery. The alert signal provided by microcontroller 12 is sent through an isolation barrier such as an opto-coupler to a diagnostic system, such as a vehicle's onboard diagnostic system.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A protection device for protecting an electrical system in a vehicle, the electrical system including a battery pack having at least one contactor, and a high voltage bus connected to the battery pack, the protection device comprising:
    a microcontroller which generates test pulses at a pulse output terminal thereof and includes a sense input terminal, the microcontroller having additional output terminals coupled to a control terminal of the at least one contactor;
    a first capacitor having a first terminal coupled to a first terminal of the at least one contactor;
    a second capacitor having a first terminal coupled to a second terminal of the at least one contactor; and
    circuitry coupled between the microcontroller and the first and second capacitors, the circuitry having an input terminal connected to the pulse output terminal of the microcontroller and an output terminal connected to the sense input terminal of the microcontroller, the circuitry reflecting the test pulses to the sense input terminal of the microcontroller if each contactor is open when the microcontroller applies a contactor opening voltage to the control terminal of the at least one contactor to open same, and presenting a signal different from the reflected test pulses to the sense input terminal of the microcontroller if any contactor is welded shut when the microcontroller applies the contactor opening voltage to the control terminal of the at least one contactor.

2. The protection device of claim 1, wherein the circuitry is powered by a voltage supply, and the circuitry charges the first and second capacitors when any contactor is closed and does not charge the first and second capacitors when each contactor is open, the first and second capacitors being coupled to the sense input terminal of the microcontroller such that a voltage at the sense input terminal of the microcontroller corresponds to a voltage across one or more of the first capacitor and the second capacitor.

3. The protection device of claim 2, wherein the circuitry comprises:
    a first transistor having a first conduction terminal coupled to the voltage supply, a second conduction terminal coupled to a second terminal of the first capacitor, and a control terminal;
    a second transistor having a first conduction terminal coupled to the control terminal of the first transistor, a second conduction terminal coupled to a second terminal of the second capacitor, and a control terminal coupled to the pulse output terminal of the microcontroller; and
    a resistor coupled between the second terminal of the first capacitor and a reference voltage, a voltage appearing at the second terminal of the first capacitor being coupled to the sense input terminal of the microcontroller.

4. The protection device of claim 3, wherein when each contactor is open, the first capacitor and the second capacitor are disconnected from each other and creates an open circuit along an electrical path defined along the second conduction terminal of the first transistor, the first capacitor, the second capacitor and the reference voltage, and when any contactor is closed, the electrical path is closed.

5. The protection device of claim 2, wherein the microcontroller is configured such that, based upon the voltage at the sense input terminal of the microcontroller, the microcontroller determines whether any contactor is welded closed and whether each contactor is open.

6. The protection device of claim 5, wherein based upon the voltage at the sense input terminal of the microcontroller, the microcontroller is further configured to determine whether any current leakage exists across the at least one contactor.

7. The protection device of claim 6, wherein based upon the voltage at the sense input terminal of the microcontroller, the microcontroller is further configured to determine an amount of current leakage across at least one contactor.

8. The protection device of claim 1, wherein the at least one contactor of the battery pack comprises a plurality of contactors, each contactor having a first terminal coupled to the first terminal of the first capacitor and a second terminal coupled to the first terminal of the second capacitor.

9. The protection device of claim 1, wherein when each contactor is open, the first capacitor and the second capacitor are disconnected from each other and creates an open circuit along an electrical path defined along a power supply which powers the circuitry, the first capacitor, the second capacitor and a ground reference, and when any contactor is closed, the electrical path is closed.

10. A protection device for protecting an electrical system in a vehicle, the electrical system including a battery pack having at least one contactor, and a high voltage bus connected to the battery pack, the protection device comprising:

a microcontroller generates test pulses at a pulse output terminal thereof and includes a sense input terminal, the microcontroller having additional output terminals coupled to a control terminal of the at least one contactor;

a first capacitor having a first terminal coupled to a first terminal of the at least one contactor;

a second capacitor having a first terminal coupled to a second terminal of the at least one contactor; and circuitry coupled between the microcontroller and the first and second capacitors, the circuitry having an input terminal connected to the pulse output terminal of the microcontroller and an output terminal connected to the sense input terminal of the microcontroller, the circuitry reflecting the test pulses to the sense input terminal of the microcontroller if each contactor is open when the microcontroller applies a contactor opening voltage to the control terminal of the at least one contactor to open same, and presenting a signal different from the reflected test pulses to the sense input terminal of the microcontroller if any contactor is welded shut when the microcontroller applies the contactor opening voltage to the control terminal of the at least one contactor, the first and second capacitors being series connected and the at least one contactor providing an electrical connection between the first and second capacitors when the at least one contactor is closed and an open connection between the first and second capacitors when each contactor is opened.

11. The protection device of claim 10, wherein the circuitry is powered by a voltage supply, and the circuitry charges the first and second capacitors to at or near the voltage supply when any contactor is closed and does not charge the first and second capacitors when each contactor is open, the first and second capacitors being coupled to the sense input terminal of the microcontroller such that a voltage at the sense input terminal of the microcontroller corresponds to a voltage across one or more of the first capacitor and the second capacitor.

12. The protection device of claim 11, wherein the circuitry comprises:

a first transistor having a first conduction terminal coupled to the voltage supply, a second conduction terminal coupled to a second terminal of the first capacitor, and a control terminal;

a second transistor having a first conduction terminal coupled to the control terminal of the first transistor, a second conduction terminal coupled to a second terminal of the second capacitor, and a control terminal coupled to the pulse output terminal of the microcontroller; and a resistor coupled between the second terminal of the first capacitor and a reference voltage, a voltage appearing at the second terminal of the first capacitor being coupled to the sense input terminal of the microcontroller.

13. The protection device of claim 12, wherein when each contactor is open, the first capacitor and the second capacitor are disconnected from each other and creates an open circuit along an electrical path defined along the second conduction terminal of the first transistor, the first capacitor, the second capacitor and the reference voltage, and when any contactor is closed, the electrical path is closed.

14. The protection device of claim 11, wherein the microcontroller is configured such that, based upon the voltage at the sense input terminal of the microcontroller, the microcontroller determines whether any contactor is welded closed and whether each contactor is open.

15. The protection device of claim 14, wherein based upon the voltage at the sense input terminal of the microcontroller, the microcontroller is further configured to determine whether any current leakage exists across the at least one contactor.

16. The protection device of claim 15, wherein based upon the voltage at the sense input terminal of the microcontroller, the microcontroller is further configured to determine an amount of current leakage across at least one contactor.

17. The protection device of claim 10, wherein the at least one contactor of the battery pack comprises a plurality of contactors, each contactor having a first terminal coupled to the first terminal of the first capacitor and a second terminal coupled to the first terminal of the second capacitor.

18. The protection device of claim 10, wherein when each contactor is open, the first capacitor and the second capacitor are disconnected from each other and creates an open circuit along an electrical path defined along a power supply which powers the circuitry, the first capacitor, the second capacitor and a ground reference, and when any contactor is closed, the electrical path is closed.

* * * * *